US008344708B2

(12) United States Patent
Jeon et al.

(10) Patent No.: US 8,344,708 B2
(45) Date of Patent: Jan. 1, 2013

(54) SWITCHING MODE POWER SUPPLY CIRCUIT FOR PLASMA DISPLAY PANEL

(75) Inventors: Peel Sik Jeon, Gyeonggi-do (KR); Dong Kyun Ryu, Jeollabuk-do (KR); Won Chan Choi, Gyeonggi-do (KR); Jae Han Yoon, Jeollabuk-do (KR); Ki Mok Kim, Gyeonggi-do (KR); Jeong Rak Lee, Seoul (KR); Seung Heun Yang, Gyeonggi-do (KR)

(73) Assignee: Samsung Electro-Mechanics Co., Ltd., Gyunggi-do (KR)

(*) Notice: Subject to any disclaimer, the term of this patent is extended or adjusted under 35 U.S.C. 154(b) by 1077 days.

(21) Appl. No.: 12/274,461

(22) Filed: Nov. 20, 2008

(65) Prior Publication Data

US 2010/0097363 A1 Apr. 22, 2010

(30) Foreign Application Priority Data

Oct. 20, 2008 (KR) ........................ 10-2008-0102479

(51) Int. Cl.
*G05F 1/00* (2006.01)
*H03H 7/00* (2006.01)

(52) U.S. Cl. ........................................ 323/222; 333/181

(58) Field of Classification Search ................ 333/1, 12, 333/181; 323/220, 222
See application file for complete search history.

(56) References Cited

U.S. PATENT DOCUMENTS 5,715,154 A * 2/1998 Rault .............................. 363/89
6,362,980 B1 * 3/2002 Ohashi et al. .............. 363/21.01
6,781,351 B2 * 8/2004 Mednik et al. ................ 323/222
7,123,494 B2 * 10/2006 Turchi ............................. 363/89
7,355,368 B2 * 4/2008 Salato et al. .................. 323/222
7,667,989 B2 * 2/2010 Liu ................................. 363/49
2003/0030421 A1 2/2003 Loef et al.
2006/0049890 A1 * 3/2006 Wasaki et al. ................... 333/12
2007/0057642 A1 * 3/2007 Pruett ........................... 315/247
2009/0168475 A1 * 7/2009 Hirosawa ........................ 363/84

FOREIGN PATENT DOCUMENTS

JP 2003-052176 A 2/2003
JP 2005094573 4/2005
JP 2005094573 A * 4/2005
KR 100822342 B1 4/2008
KR 1020080047866 5/2008

OTHER PUBLICATIONS

Korean Office Action for Application No. 10-2008-012479 mailed Dec. 21, 2009.
Korean Notice of Allowance for Application No. 10-2008-012479 mailed Apr. 13, 2010.

* cited by examiner

*Primary Examiner* — Dean O Takaoka
*Assistant Examiner* — Alan Wong
(74) *Attorney, Agent, or Firm* — Lowe, Hauptman, Ham & Berner, LLP

(57) ABSTRACT

Provided is a switching mode power supply circuit for plasma display panel, which includes an EMI filter unit, a PFC unit, an output unit, and a standby unit. The EMI filter unit may include a first line filter connected to a commercial line input power, a first capacitor and discharge resistor connected to the first line filter, a second line filter connected to the first capacitor and discharge resistor, a second capacitor connected to the second line filter, and a relay unit disposed between the first line filter and the first capacitor and discharge resistor. The standby unit may be connected to a contact point of the first line filter and the relay unit.

7 Claims, 2 Drawing Sheets

SWITCHING MODE POWER SUPPLY CIRCUIT FOR PLASMA DISPLAY PANEL

CROSS-REFERENCE TO RELATED APPLICATIONS

This application claims the benefit of Korean Patent Application No. 10-2008-0102479 filed with the Korea Intellectual Property Office on Oct. 20, 2008, the disclosure of which is incorporated herein by reference.

BACKGROUND OF THE INVENTION

1. Field of the Invention

The present inventive concept relates to a switching mode power supply circuit for plasma display panel, and more particularly, to a switching mode power supply circuit for plasma display panel, in which a discharge resistor and a capacitor of an EMI filter unit are disposed following a relay unit, thereby reducing power consumption of the discharge resistor.

2. Description of the Related Art

In general, a plasma display panel is a flat panel display using a penning gas in a discharge phenomenon. Such a plasma display panel employs a light emission caused by a discharge which is generated between narrow electrodes coated with dielectric by using neon (Ne) or helium (He) of relatively high pressure as a base gas.

A switching mode power supply (SMPS) circuit is used to drive the plasma display panel. The switching mode power supply circuit is a module type power supply device that converts an external voltage into a voltage suitable for the plasma display panel. The switching mode power supply circuit uses semiconductor switching characteristics to control on/off operations and lessen impacts with respect to high frequencies above a commercial frequency. In particular, a switching mode power supply circuit for plasma display panel is required to supply power to each component in accordance with specific sequences in order to protect switching elements and prevent abnormal discharge upon initial power supply.

Compared with a cathode ray tube (CRT) which has been mainstream of display device, the plasma display panel is slim and light and can realize high definition and large screen. Thus, the current flat panel display fields are divided into plasma display panel and liquid crystal display (LCD).

In recent years, however, many efforts have been made to reduce standby power consumption for the purpose of energy saving throughout the world. Accordingly, there is a need for technology that can reduce standby power consumption in the switching mode power supply circuit.

SUMMARY OF THE INVENTION

An advantage of the present inventive concept is that it provides a switching mode power supply circuit for plasma display panel, in which a discharge resistor and a capacitor of an EMI filter unit are disposed following a relay unit, thereby reducing power consumption of the discharge resistor.

Additional aspects and advantages of the present general inventive concept will be set forth in part in the description which follows and, in part, will be obvious from the description, or may be learned by practice of the general inventive concept.

According to an aspect of the present inventive concept, there is provided a switching mode power supply circuit for plasma display panel, including: an EMI filter unit; a PFC unit; an output unit; and a standby unit, wherein the EMI filter unit includes: a first line filter connected to a commercial line input power; a first capacitor and discharge resistor connected to the first line filter; a second line filter connected to the first capacitor and discharge resistor; a second capacitor connected to the second line filter; and a relay unit disposed between the first line filter and the first capacitor and discharge resistor, the standby unit being connected to a contact point of the first line filter and the relay unit.

The relay unit may include: a first switch having one terminal connected the first line filter; a second switch having one terminal connected to the other terminal of the first switch, and the other terminal connected to the first capacitor and discharge resistor; and a negative temperature coefficient (NTC) resistor connected in parallel to the first switch.

The first switch and the second switch may be transistors.

The first switch and the second switch of the relay unit may become open states in a standby mode, whereby power consumption of the discharge unit of the EMI filter unit is reduced.

The first line filter and the second line filter may be common mode filters.

The first line filter may be a common mode filter, and the second line filter may be a normal mode filter.

The first line filter may be a normal mode filter, and the second line filter may be a common mode filter.

The first line filter and the second line filter may be normal mode filters.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
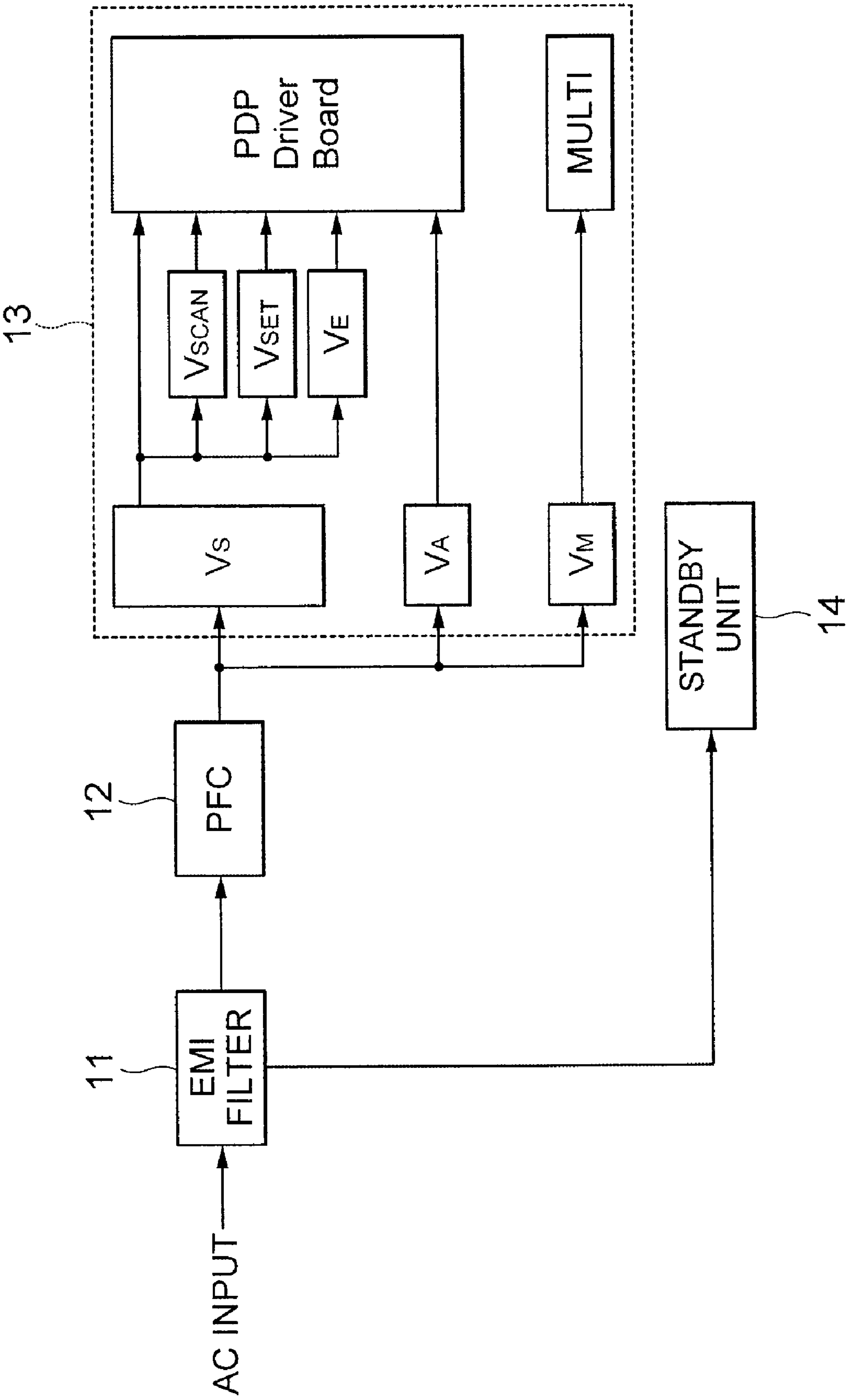
FIG. 1 is a block diagram of a switching mode power supply circuit for plasma display panel according to an embodiment of the present inventive concept.

The present inventive concept will now be described more fully with reference to the accompanying drawings, in which exemplary embodiments of the invention are shown. The present inventive concept may, however, be embodied in many different forms and should not be construed as being limited to the embodiments set forth herein; rather, these embodiments are provided so that this disclosure will be thorough and complete, and will fully convey the concept of the invention to those skilled in the art. In the following description, well-known functions or constructions are not described in detail since they would obscure the invention in unnecessary detail.

Although terms like "first" and "second" are used to describe various elements, these elements are not limited to these terms. These terms are used only to differentiate one element from another.

Terms used herein are for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, numbers, steps, operations, elements, components, and/or groups thereof, but do not preclude the presence or addition of one or more other features, numbers, steps, operations, elements, components, and/or groups thereof.

Hereinafter, switching mode power supply circuits for plasma display panel according to embodiments of the present inventive concept will be described in detail with reference with the accompanying drawings. In the following description, like reference numerals denote like elements throughout, and duplicated description will be omitted.

FIG. 1 is a block diagram of a switching mode power supply circuit for plasma display panel according to an embodiment of the present inventive concept.

Referring to FIG. 1, the switching mode power supply circuit for plasma display panel according to an embodiment of the present inventive concept may include an EMI filter unit 11, a power factor correction (PFC) unit 12, an output unit 13, and a standby unit 14.

The EMI filter unit 11 may be connected to a commercial line input power. The EMI filter unit 11 may be directly connected to a commercial line input port to receive a voltage of 90-270 $V_{rms}$ from the commercial line input power, and suppress external high-frequency noise and internal high-frequency noise.

The PFC unit 12 is connected to the EMI filter unit 11, and outputs a DC voltage of about 370-400 $V_{DC}$ by setting up or boosting up the commercial line input power of 90-270 $V_{rms}$ passing through the EMI filter unit 11 in order to avoid harmonics regulation. Then, the PFC unit 12 supplies various voltages necessary to drive the plasma display panel through a plurality of DC/DC converters.

In addition, the PFC unit 12 performing the power factor correction is disposed following the EMI filter unit 11 and mainly adopts a boost topology which exhibits excellent PFC performance.

The output unit 13 may include a plurality of DC/DC converters supplying a sustain driving voltage $V_S$ and an address voltage $V_A$, which are high voltages, and a plurality of DC/DC converters supplying a plurality of low voltages $V_M$.

Furthermore, the output of the sustain driving voltage $V_S$ is used as the sustain driving voltage $V_S$ and simultaneously input to a scan voltage $V_{SCAN}$ and reset voltages $V_{SET}$ and $V_E$. Voltages output from the plurality of DC/DC converters are input to a PDP driver board to drive the plasma display panel.

Meanwhile, a plurality of low-voltage devices to which the low voltages $V_M$ are supplied by the DC/DC converters are represented by "MULTI".

The standby unit 14 may be connected to the EMI filter unit 11 to output a standby voltage in a standby mode.

Figure 2:
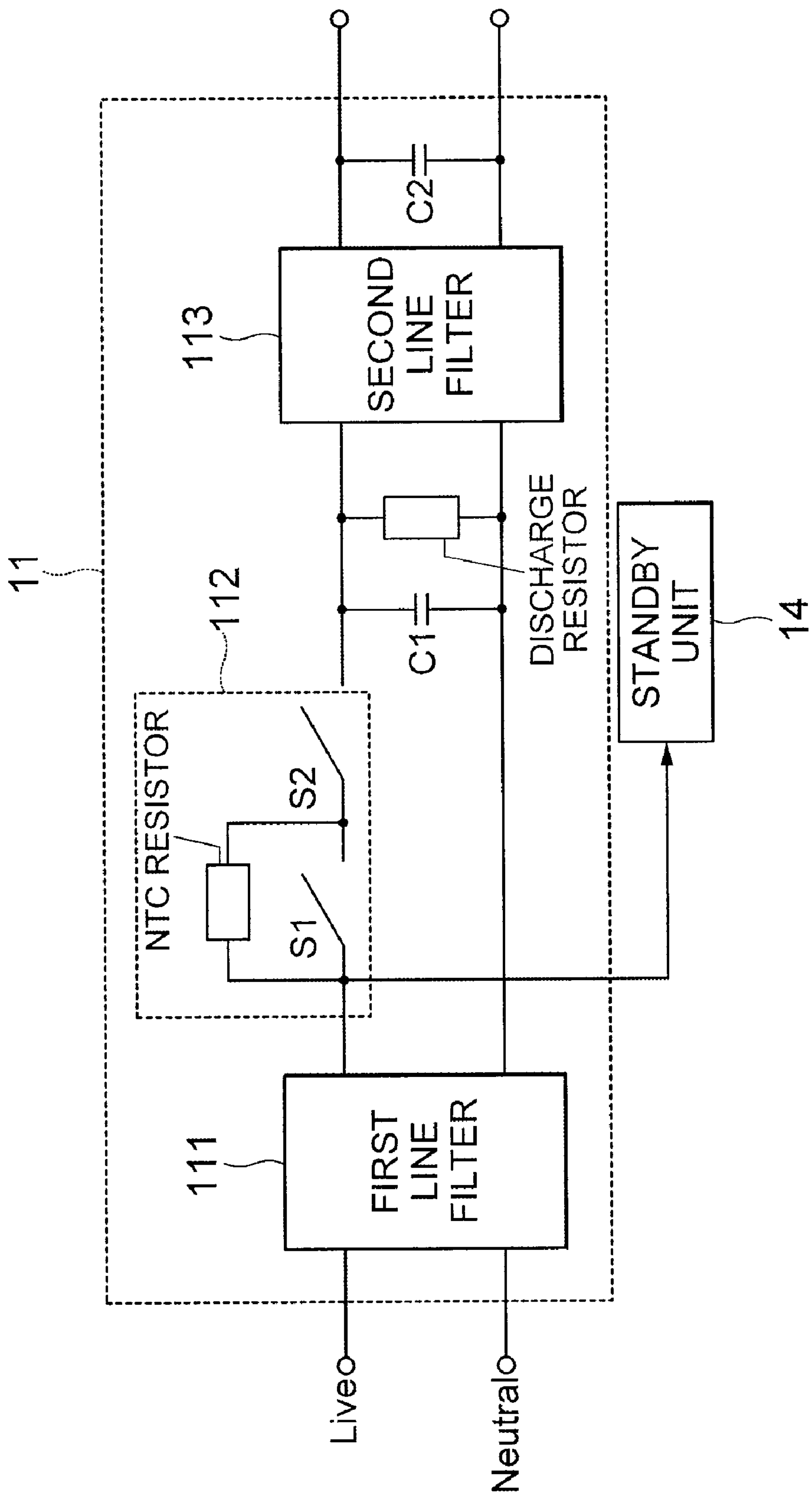
FIG. 2 is a detailed circuit diagram of an EMI filter unit in the switching mode power supply circuit for plasma display panel according to an embodiment of the present inventive concept.

FIG. 2 is a detailed circuit diagram of the EMI filter unit 11 in the switching mode power supply circuit for plasma display panel according to an embodiment of the present inventive concept.

Referring to FIG. 2, the EMI filter unit 11 may include a first line filter 111, a first capacitor C1, a discharge resistor, a second line filter 113, and a second capacitor C2.

The first line filter 111 is connected to the commercial line input power, and the first capacitor C1 and the discharge resistor are connected to the first line filter 111. Furthermore, the first capacitor C1 and the discharge resistor are sequentially connected to the second line filter 113 and the second capacitor C2.

In this case, the first line filter 111 and the second line filter 113 may be common mode filters or normal mode filters. That is, both of the first line filter 111 and the second line filter 113 may be the common mode filters; the first line filter 111 may be the common mode filter and the second line filter 113 may be the normal mode filter; the first line filter 111 may be the normal mode filter and the second line filter 113 may be the common mode filter; or both of the first line filter 111 and the second line filter 113 may be the normal mode filters.

Due to the discharge test under the safety regulation, the EMI filter of the switching mode power supply circuit necessarily uses the discharge resistor. The use of the discharge resistor, however, increases the standby power consumption.

Accordingly, in order to prevent the power consumption of the discharge resistor in the standby mode, a relay unit 112 may be disposed between the first line filter 111 and the first capacitor C1 and discharge resistor. Furthermore, the contact point of the first line filter 111 and the relay unit 112 may be connected to the standby unit 114.

Meanwhile, the relay unit 112 may include: a first switch S1 having one terminal connected to the first line filter 111; a second switch S2 having one terminal connected to the other terminal of the first switch S1, and the other terminal connected to the first capacitor C1 and the discharge resistor; and a negative temperature coefficient (NTC) resistor connected in parallel to the first switch S1.

The first switch S1 and the second switch S2 may be transistors.

Upon operation of the relay unit 112, the second switch S2 becomes a closed state and the first switch S1 becomes an open state, so that the commercial line input power is applied to the first capacitor C1 and the discharge resistor through the NTC resistor. In this case, the NTC resistor serves to prevent an overcurrent from flowing into the PFC unit 12. Thereafter, the first switch S1 becomes a closed state.

In the related art, the relay unit 112 is disposed behind the EMI filter unit so that the discharge resistor consumes power even in the standby mode. In the switching mode power supply circuit for plasma display panel according to the embodiment of the present inventive concept, the first capacitor C1 and the discharge resistor of the EMI filter unit 11 are disposed following the relay unit 112. Thus, the first switch S1 and the second switch S2 of the relay unit 112 become the open state in the standby mode, thereby reducing the power consumption of the discharge resistor.

That is, since the standby unit 114 is connected between the first line filter 111 and the relay unit 112, the path where the discharge resistor is disposed becomes an open state in the standby mode, thereby reducing the power consumption of the discharge resistor.

Therefore, the switching mode power supply circuit for plasma display panel according to the embodiment of the present inventive concept can reduce the standby power consumption much more than in the related art.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

A lot of other embodiments fall within the scope of the present inventive concept.

What is claimed is:

1. A switching mode power supply circuit for plasma display panel, comprising:

an EMI filter unit configured to be connected to a commercial line input power;

a PFC unit connected to the EMI filter unit;

an output unit connected to the PFC unit; and a standby unit connected to the EMI filter unit, wherein the EMI filter unit includes:

a first line filter configured to be connected to the commercial line input power;

a first capacitor and discharge resistor connected to the first line filter;

a second line filter connected to the first capacitor and discharge resistor;

a second capacitor connected to the second line filter; and a relay unit disposed between the first line filter and the first capacitor and discharge resistor, the standby unit being connected to a contact point of the first line filter and the relay unit, and the relay unit includes:

a first switch having a first terminal connected the first line filter;

a second switch having a first terminal connected to a second terminal of the first switch, and a second terminal connected to the first capacitor and the discharge resistor; and a negative temperature coefficient (NTC) resistor connected in parallel to the first switch.

2. The switching mode power supply circuit according to claim 1, wherein the first line filter and the second line filter are normal mode filters.

3. The switching mode power supply circuit according to claim 1, wherein the first switch and the second switch are transistors.

4. The switching mode power supply circuit according to claim 1, wherein the first switch and the second switch are configured to be opened in a standby mode, whereby power consumption of the discharge resistor of the EMI filter unit is reduced.

5. The switching mode power supply circuit according to claim 1, wherein the first line filter and the second line filter are common mode filters.

6. The switching mode power supply circuit according to claim 1, wherein the first line filter is a common mode filter, and the second line filter is a normal mode filter.

7. The switching mode power supply circuit according to claim 1, wherein the first line filter is a normal mode filter, and the second line filter is a common mode filter.

* * * * *